United States Patent
Meadows et al.

(10) Patent No.: US 8,183,658 B2
(45) Date of Patent: May 22, 2012

(54) FIELD-EFFECT TRANSISTOR (FET) WITH EMBEDDED DIODE

(75) Inventors: Ronald C. Meadows, Hardy, VA (US); Thomas A. Winslow, Salem, VA (US)

(73) Assignee: Cobham Electronic Systems Corporation, Bolton, MA (US)

(*) Notice: Subject to any disclaimer, the term of this patent is extended or adjusted under 35 U.S.C. 154(b) by 655 days.

(21) Appl. No.: 12/128,566

(22) Filed: May 28, 2008

(65) Prior Publication Data
US 2008/0296687 A1 Dec. 4, 2008

Related U.S. Application Data

(60) Provisional application No. 60/932,309, filed on May 29, 2007.

(51) Int. Cl.
*H01L 29/772* (2006.01)

(52) U.S. Cl. .......... 257/469; 257/470; 257/E29.347; 330/289

(58) Field of Classification Search .......... 257/360, 257/491, 331, 469, 470, 467, E29.347; 330/289
See application file for complete search history.

(56) References Cited

U.S. PATENT DOCUMENTS

| | | | | |
|---|---|---|---|---|
| 3,434,068 A * | 3/1969 | Sevin | .......... | 330/277 |
| 5,420,537 A * | 5/1995 | Weedon et al. | .......... | 330/251 |
| 5,726,481 A * | 3/1998 | Moody | .......... | 257/467 |
| 5,903,854 A * | 5/1999 | Abe et al. | .......... | 455/575.1 |
| 6,559,513 B1 | 5/2003 | Miller et al. | | |
| 2002/0014639 A1 * | 2/2002 | Imai et al. | .......... | 257/227 |

* cited by examiner

*Primary Examiner* — Evan Pert
*Assistant Examiner* — Scott Stowe
(74) *Attorney, Agent, or Firm* — Jaeckle Fleischmann & Mugel, LLP

(57) ABSTRACT

A Field-Effect Transistor (FET) is provided that includes a first portion and a second portion separated from the first portion by a gap. The FET further includes at least one diode embedded within the gap between the first and second portions. A plurality of FETs also may be provided with adjacent FETs electrically isolated.

17 Claims, 4 Drawing Sheets

US 8,183,658 B2

FIELD-EFFECT TRANSISTOR (FET) WITH EMBEDDED DIODE

CROSS REFERENCE TO RELATED APPLICATIONS

This application claims priority to and the benefit of the filing date of U.S. Provisional Application No. 60/932,309 filed May 29, 2007 for "COMPACT THERMAL COMPENSATION OF LARGE FET ARRAYS," which is hereby incorporated by reference in its entirety.

BACKGROUND OF THE INVENTION

The present invention relates generally to semiconductor devices, such as Field-Effect Transistors (FETs).

Gallium Arsenide (GaAs) Metal-Semiconductor Field-Effect Transistors (MESFETS) are well known devices for providing amplification at microwave frequencies, high-speed digital switching and various other functions in different applications. The use of microwave devices in satellite-based and wireless communications has also grown in recent years. There is large market in such areas for MESFETs having very high power capability per unit length of periphery, typically expressed in watts/mm. As the power capability or output of transistors improves, a single transistor can provide the power that in previous generations was provided by multiple transistors, which results in a cost, volume, and weight savings. Moreover, the greater the power capability of a transistor, the broader its potential applications and the larger the potential market. Thus, there has been a great deal of activity directed toward improving the performance of transistors for different applications including military, industrial and commercial applications. Operating these transistors at higher voltages is a preferred method for increasing the operational power density of a FET capable of supporting the higher operating voltages.

Some conventional high voltage MESFETs have a positive temperature coefficient as described, for example, in U.S. Pat. No. 6,559,513, which is hereby incorporated by reference herein in its entirety. A positive temperature coefficient can cause a drain current of a FET to increase when a temperature increase occurs under a fixed bias (e.g., constant applied gate and drain voltages). As a result, the FET circuit heats up even more, which then causes the drain current to further increase. This positive feedback phenomenon can result in a problem called "thermal runaway." This "thermal runaway" behavior is often experienced in heterojunction bipolar transistors (HBTs), for which base and emitter ballasting techniques are known for compensating for the behavior.

The positive temperature coefficient inherent in high voltage FET technology also causes significant thermal asymmetry to occur in an uncompensated large array of FETs having gate connections or fingers used, for example, in output stages of high power amplifiers. These thermal asymmetries can cause premature circuit failure, poor robustness and poor power performance. Accordingly, it is desirable to address the problem of thermal runaway so that FETs having a positive temperature coefficient can be more efficiently operated and provide a longer useful life.

BRIEF DESCRIPTION OF THE INVENTION

In accordance with an exemplary embodiment, a Field-Effect Transistor (FET) is provided that includes a first portion and a second portion separated from the first portion by a gap. The FET further includes at least one diode embedded within the gap between the first and second portions.

In accordance with another exemplary embodiment, a Field-Effect Transistor (FET) array is provided that includes a plurality of FETs. Each of the plurality of FETs is electrically isolated from an adjacent FET. The FET array also includes at least one diode embedded within each of the plurality of FETs.

DETAILED DESCRIPTION OF THE INVENTION

Figure 1:
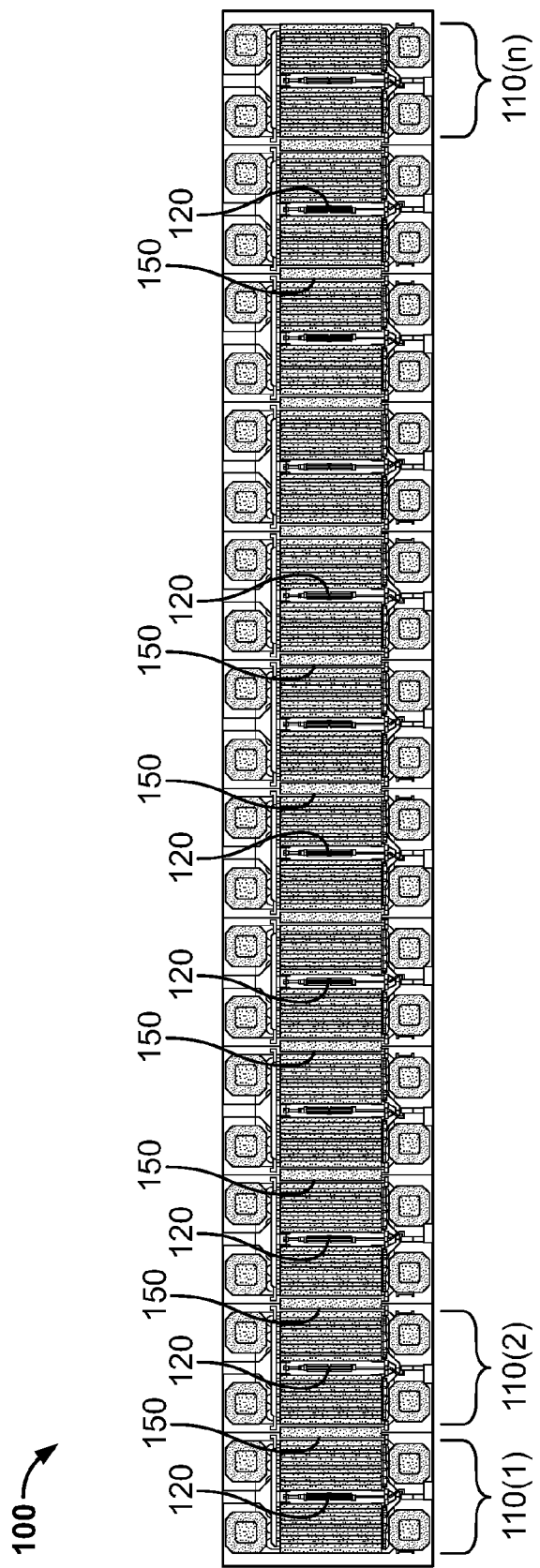
FIG. 1 illustrates a top view of an embedded array of unit Field-Effect Transistor (FET) cells formed in accordance with an exemplary embodiment of the invention.

For simplicity and ease of explanation, the invention will be described herein in connection with various embodiments thereof. Those skilled in the art will recognize, however, that the features and advantages of the various embodiments may be implemented in a variety of configurations. It is to be understood, therefore, that the embodiments described herein are presented by way of illustration, not of limitation.

As used herein, an element or step recited in the singular and proceeded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property. Additionally, the arrangement and configuration of the various components described herein may be modified or changed, for example, replacing certain components with other components or changing the order or relative positions of the components.

Various embodiments of the present invention provide a transistor or other semiconductor device having embedded components therein. For example, a Field-Effect Transistor (FET) structure may be provided that mitigates "thermal runaway" by embedding at least one diode into the body of an individual unit FET cell (e.g., one FET within an FET array). In at least one embodiment, a localized thermal compensation network having the at least one diode is embedded into the body of an individual unit FET cell which, when combined with multiple unit cells each having localized thermal compensation, provides an FET array structure with improved thermal compensation characteristics. The localized thermal compensation network senses local thermal runaway and compensates for the local thermal runaway on an individual FET cell basis. Thus, a thermal compensation network associated with each of the plurality of FETs, wherein each thermal compensation network is embedded within portions of each FET, compensates for local thermal runaway.

More particularly, described herein are methods and apparatus related to localized thermal compensation (e.g., local FET temperature compensation) in semiconductor device, such as transistor devices. The methods and apparatus described herein provide for a compact and efficient device to overcome thermal runaway by providing localized negative feedback to individual unit FET cells of an FET cell array via an embedded thermal compensating bias network. To that end, the methods and apparatus of the various embodiments of the present invention are described below with reference to exemplary embodiments and figures. It should be understood, however, that these exemplary embodiments and figures are provided to illustrate and to facilitate an understanding of the concepts relevant to the present disclosure and as such, should not be interpreted as limiting.

As illustrated in FIG. 1, and in accordance with an exemplary embodiment of the invention, an array 100 of unit FET cells 110(1) ... 110(n) is provided. The array 100 of unit FET cells 110(1) ... 110(n) can, for example, be employed as output stages for high powered amplifiers (HPAs). Each unit FET cell 110(1) ... 110(n) may define individual FET structures. The unit FET cells 110(1) ... 110(n), which may be 3-6 millimeters (mm) in periphery, each include one or more embedded components, for example, an embedded thermal compensation bias network 120. The thermal compensation bias network 120, which is shown integrated into (e.g., embedded within) the array 100 is employed to reduce or prevent thermal runaway as generally discussed herein. Moreover, an electrical isolation circuit 150 is provided between each of the unit FET cells 110(1) ... 10(n) and which may provide direct-current (DC) isolation between adjacent ones of the unit FET cells 110(1) ... 110(n).

Figure 2:
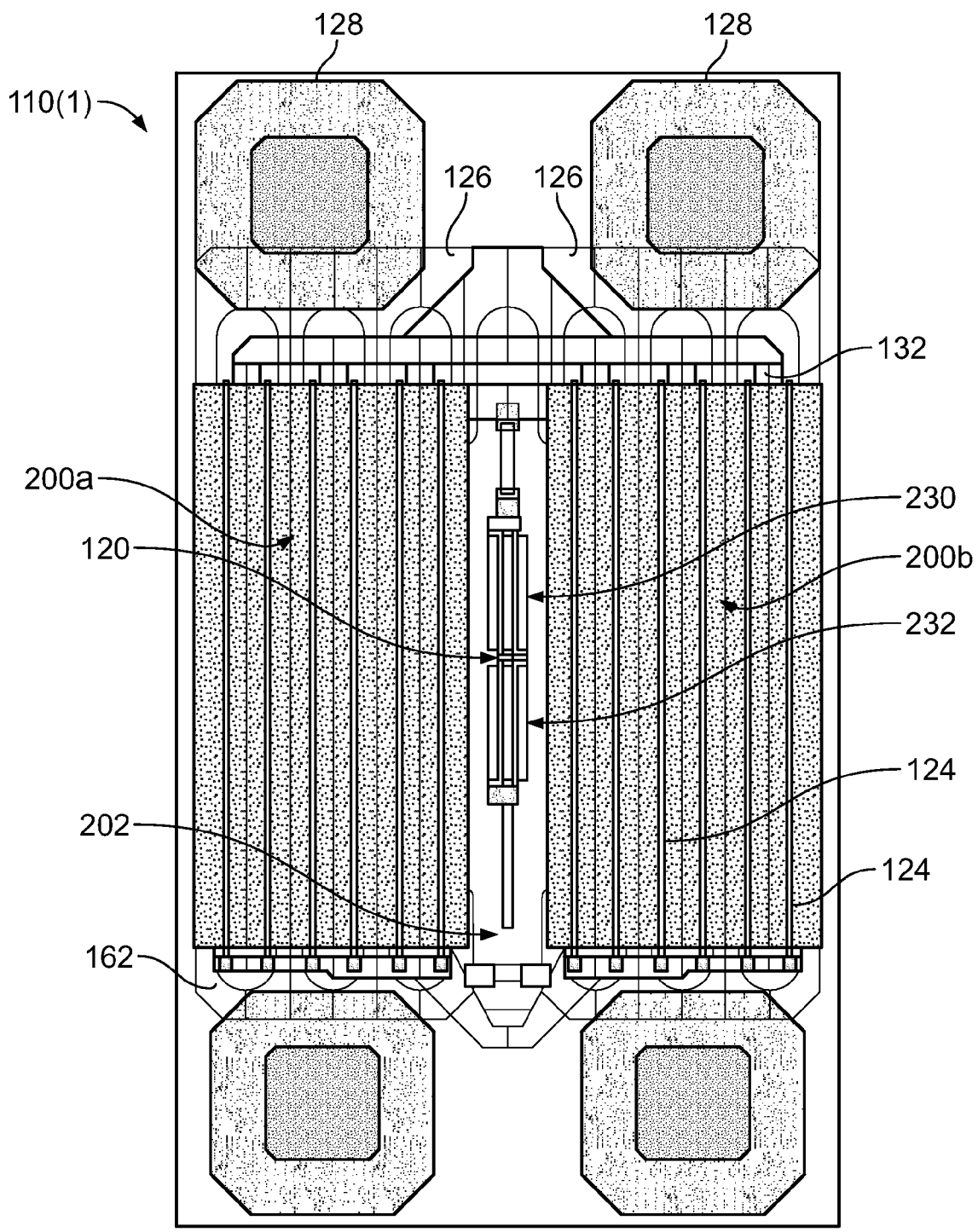
FIG. 2 illustrates a top view of a single unit FET cell used in the array illustrated in FIG. 1 and showing a temperature compensation bias network embedded within the body of the unit FET cell formed in accordance with an exemplary embodiment of the present invention.

FIG. 2 illustrates a single unit FET cell 110(1) which, in accordance with an exemplary embodiment of the invention, is split or divided into two separate portions 200a and 200b, which may or may not be equal halves of the unit FET cell 110(1). It should be noted that although only a single unit FET cell 110(1) is shown and described, a similar structure is provided by the other FET cells. The thermal compensation bias network 120 in one embodiment is embedded within a gap 202 (e.g., space) between the two portions 200a, 200b of the unit FET cell 110(1) to provide localized thermal compensation. The gap 202 defines a channel or middle area between the two portions 200a, 200b. The thermal compensation bias network 120 includes one or more diodes (two diodes 230 and 232 are shown) that operate to sense temperature changes, for example, in the unit FET cell 110(1). In particular, the forward voltage ($V_f$) of the one or more diodes 230 and 232 is variable with temperature. Accordingly, as the temperature of the FET cell 110(1) varies, the forward voltage of the one or more diodes 230 and 232 varies correspondingly. The forward-voltage is applied to the gate 130 of the unit FET cell 110(1) via gate fingers 124 that are connected to gates 130 (shown in FIG. 3) of the unit FET cell 110(1). Thus, the change in forward voltage changes an applied gate voltage to gates 130 of the unit FET cell 110(1).

It should be noted that a source 126 of the FET cell 110(1) is connected to ground through a via 128 and a drain 132 provides a positive temperature coefficient output as described in more detail herein. It further should be noted that the FET cell 110(1) and the embedded or implanted components thereof may be formed using different processes, for example, a multi-layer plating or implantation process as is known. Also, different types, numbers and configurations of components may be embedded within the unit FET cell 110 (1). Accordingly, the various embodiments are not limited to embedding the thermal compensation bias network 120 within the gap 202.

Figure 3:
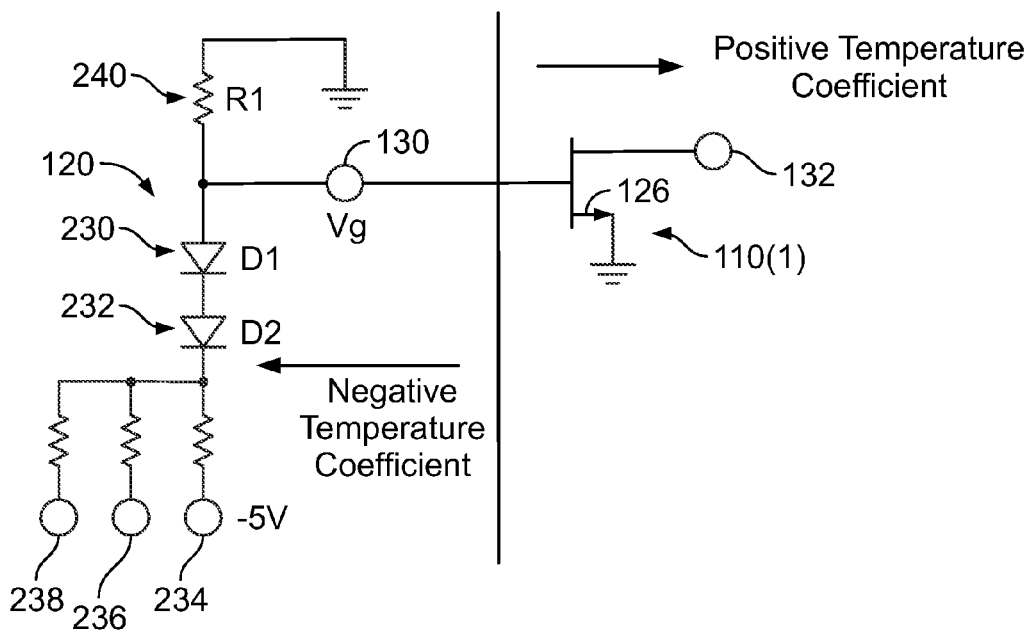
FIG. 3 illustrates a schematic diagram of a unit FET cell and a thermal compensation bias network formed in accordance with exemplary embodiments of the present invention.

A circuit diagram of the thermal compensation bias network 120 embedded within the unit FET cell 110(1) is illustrated in FIG. 3. The thermal compensation bias network 120 includes in one embodiment the two diodes 230 (D1) and 232 (D2) (connected in series in this embodiment) that operate to transform down a reference voltage, for example, illustrated as an externally applied negative five (−5) volts at the terminal 234. In one embodiment, the diodes 230 and 232 transform down the negative five volts at the terminal 234 to a negative three and a half (−3.5) volts (−Vg) that is applied as a bias voltage to the gate 130 of the unit FET cell 110(1). Additional terminals 236 and 238 optionally may be provided. It should be noted that the diode 230 operates as a current source when too much current (e.g., excessive forward current) is applied to the thermal compensation bias network 120, for example, as a result of a large temperature change in the FET cell 110(1). Additionally, while two diodes 230 and 232 are shown, one of ordinary skill would understand that more or less diodes may be employed to ensure proper temperature compensation or provide other operations.

A thin film or implanted resistor 240 (R1) is also connected in series with the diodes 230 and 232. The resistor 240 is used to set the current drawn by the thermal compensation bias network 120 (and may be referred to as a set current resistor). In operation, the diodes 230 and 232 sense changes in temperature, for example, the localized temperature rise due to the self heating of the unit FET cell 110(1), an increase in ambient temperature or heating caused by adjacent unit FET cells, while the resistor 240 provides negative feedback to the unit FET cell 110(1). Moreover, the two diodes 230 and 232 along with the resistor 240 are thermally coupled to the individual FET cell 110(1).

When the temperature of the thermal compensation bias network 120 embedded within the unit FET cell 110(1) increases, which may result from the power dissipation of the unit FET cell 110(1), the voltage of the two diodes 230 and 232 decreases, resulting in the resistance of the resistor 240 (operating as a thermal feedback resistor) increasing. This increase in the resistance of the resistor 240 causes a decrease in the gate voltage (Vg) applied to the unit FET cell 110(1), which decreases the power dissipation of the unit FET cell 110(1). Thus, the positive temperature coefficient of the unit FET cell 110(1) is compensated by the negative thermal feedback of the thermal compensation bias network 120. It should be noted that the source 126 of the unit FET cell 110(1) is grounded and the drain 132 of the unit FET cell 110(1) provides a positive temperature coefficient output.

Figure 4:
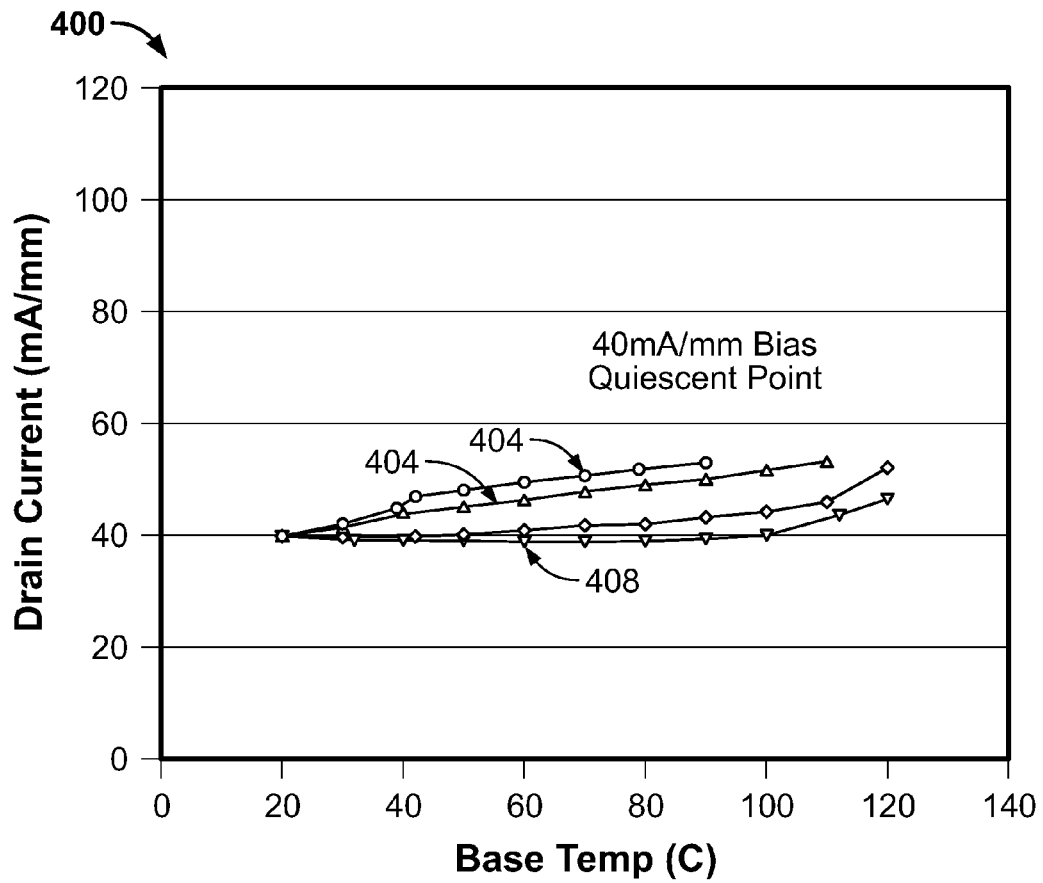
FIG. 4 is a graphical illustration of drain current stability versus base temperature with and without a thermal compensation bias network.

FIG. 4 is a graph 400 of a quiescent bias current stability versus temperature for a single 4mm unit FET cell with and without an external bias network. In particular, when no thermal compensation bias network 120 is provided, which corresponds to the curves 404, an increase in base temperature increases the unit FET cell junction temperature, which causes the drain current to increase, thereby causing an increase in drain current, resulting in thermal runaway. When the thermal compensation bias network 120, which may be configured as a double stacked diode bias network as shown in FIG. 3, is thermally coupled to the FET structure, which corresponds to the curves 408, the network maintains a unit FET cell bias current stable over a 100 degrees Celsius base plate temperature range. Also, when a unit cell is employed (e.g., juxtaposed) with other unit FET cells, coupled heating occurs. In an FET array that is biased from a common supply, significant thermal non-uniformity across the body of the juxtaposed unit cells can occur.

In conventional FET arrays, the gate bias is locally shared between unit FET cells through bias resistors, oscillation stability resistors or odd mode suppression resistors. This configuration promotes uniform application of the gate voltage from cell to cell, but does not allow an individual cell, within an array of FET cells, to be thermally compensated. However even slight variations in threshold voltage from FET to FET, dielectric film stresses, wafer thickness and die attach materials, can cause localized thermal runaway of a FET cell that can then result in thermal asymmetries.

Various embodiments of the invention also provide for the gate bias of each unit FET cell to be electrically isolated from adjacent unit FET cells. As a result of the electrical isolation, each unit FET cell 110(1) . . . 110(n) is able to individually respond to localized temperature fluctuations. Thus, thermal runaway caused by a positive temperature coefficient is reduced or eliminated. By providing localized negative feedback (associated with the thermal compensation bias network 120) to individual unit FET cells 110(1) . . . 110(n) within the array 100, thermal runaway is reduced or avoided.

Figure 5:
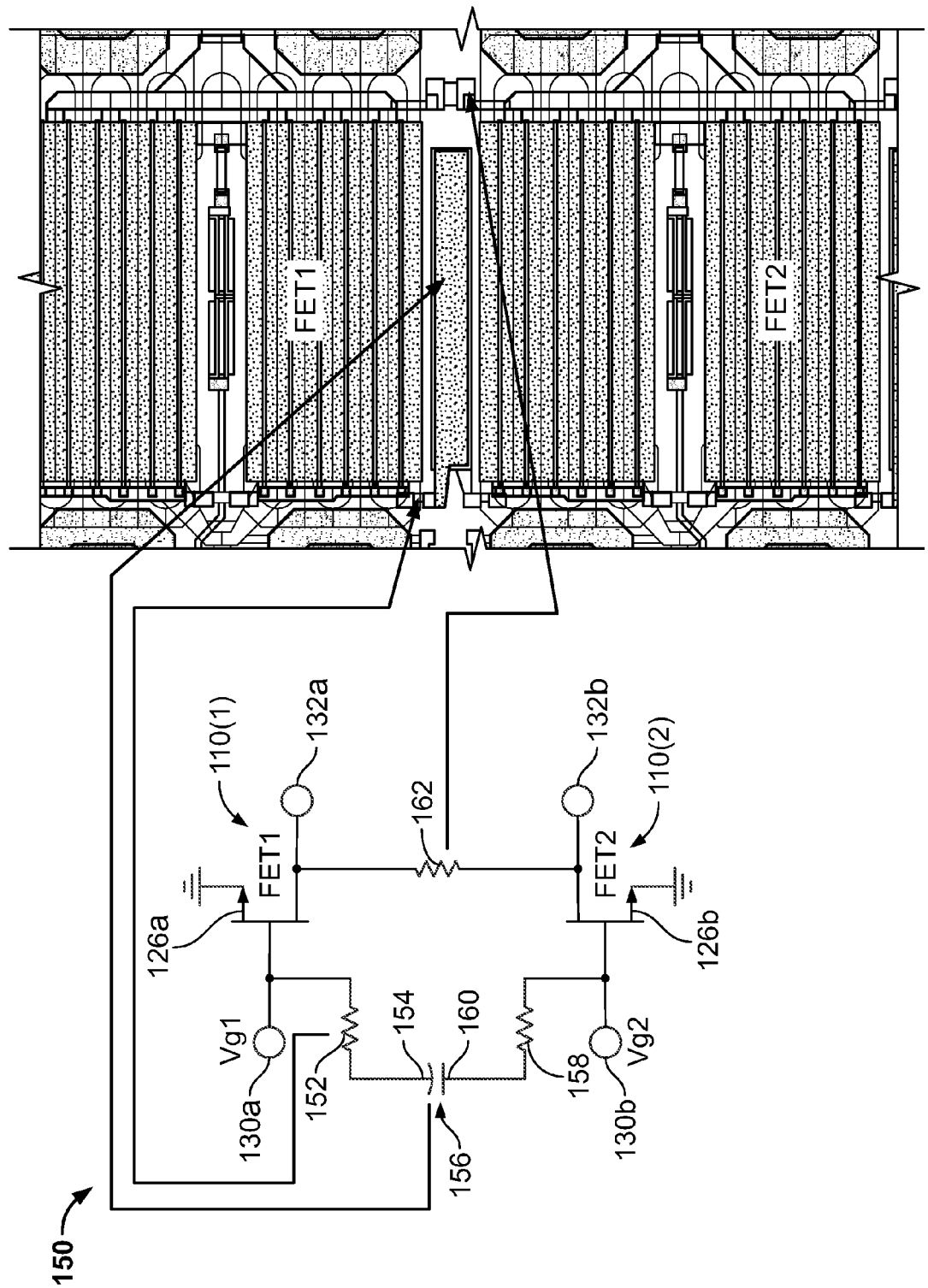
FIG. 5 illustrates a top view of a circuit as well as a schematic circuit diagram providing gate isolation between two adjacent FET devices to implement active thermal compensation in accordance with an exemplary embodiment of the present invention.

Specifically, the various embodiments provide electrical gate bias isolation, and in particular, odd-mode oscillation suppression as shown in FIG. 5. In particular, the electrical isolation circuit 150, for example, a DC isolation circuit is connected between the gates 130a and 130b, respectively, of the unit FET cells 110(1) and 110(2). It should be noted that although unit FET cells 110(1) and 110(2) are shown, electrical gate isolation can be provided between all of the unit FET cells 110(1) . . . 110(n) of the array 100. The electrical isolation circuit 150 includes a first resistor 152 connected between the gate 130a of the unit FET cell 110(1) and a first end 154 of a capacitor 156 and a second resistor 158 connected between the gate 130b of the unit FET cell 110(2) and a second end 160 of the capacitor 156. A resistor 162 is also connected between the drain 132a of the unit FET cell 110(1) and the drain 132b of the unit FET cell 110(2).

In operation, the capacitor 156 electrically isolates the gates 130a and 130b of the unit FET cells 110(1) and 110(2), while still providing high frequency odd-mode oscillation suppression (using the resistor 162). Accordingly, the thermal compensation bias network 120 shown in FIGS. 1-3 may be connected at each of the nodes Vg1 and Vg2 of the gates 130a and 130b of the unit FET cells 110(1) and 110(2). Thus, DC isolation and RF feedback are both provided.

Accordingly, various embodiments of the invention provide unit FET cells having components embedded or integrated within the unit FET cells, for example, in a gap formed between two portions of each of the unit FET cells. The embedded or integrated components may include one or more diodes that provide localized temperature compensation at the unit FET cell level.

While the exemplary embodiments of the invention employ a thermal compensation bias network for use with FET cells, it should be appreciated that the thermal compensation bias network may be employed in connection with other heat generating transistor devices such as heterojunction bipolar transistors (HBTs) or pHEMT/HEMT with a positive temperature coefficient as described herein. Also, the various embodiments may be employed independent of material systems and can for example, be implemented in devices constructed of different materials such as Silicon-Germanium (SiGe), Gallium Arsenide (GaAs), Gallium Nitride (GaN) and Silicon Carbide (SiC), among others.

Although the method and apparatus disclosed herein have been described in terms of exemplary embodiments, they are not limited thereto. Rather, the appended claims should be construed broadly to include other variants and embodiments of the disclosure which may be made by those skilled in the art without departing from the scope and range of equivalents of the disclosure.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. For example, the ordering of steps recited in a method need not be performed in a particular order unless explicitly stated or implicitly required (e.g., one step requires the results or a product of a previous step to be available). While the dimensions and types of materials described herein are intended to define the parameters of the invention, they are by no means limiting and are exemplary embodiments. Many other embodiments will be apparent to those of skill in the art upon reviewing and understanding the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A Field-Effect Transistor (FET) comprising:
   a first portion;
   a second portion separated from the first portion by a gap;
   a thermal feedback resistor connected in series with a pair of diodes embedded within the gap between the first and second portions forming part of a thermal compensation bias network, the thermal feedback resistor setting a current drawn by the thermal compensation bias network and the diodes sensing changes in a localized temperature of the FET; and
   an electrical isolation circuit electrically connected to a gate operating to provide active thermal compensation with the thermal compensation bias network.

2. A FET in accordance with claim 1 further comprising gate fingers and wherein the gap is between gate fingers of the first portion and gate fingers of the second portion.

3. A FET in accordance with claim 1 wherein the thermal compensation bias network is configured to compensate for a positive temperature coefficient.

4. A FET in accordance with claim 1 wherein the thermal compensation bias network is configured to provide a localized negative feedback.

5. A FET in accordance with claim 1 wherein the thermal feedback resistor is an implanted resistor.

6. A FET in accordance with claim 1 wherein the thermal feedback resistor is a film resistor.

7. A FET in accordance with claim 1 wherein the first and second portions comprise first and second halves of a body and the pair of diodes is embedded within the body in the gap between the first and second halves.

8. A FET in accordance with claim 1 wherein the gap is provided along a middle area between the first and second portions.

9. A FET in accordance with claim 1 wherein the gap defines a channel between the first and second portions.

10. A Field-Effect Transistor (FET) array comprising:
a plurality of FETs;
an electrical isolation circuit electrically connected between and in direct contact with the plurality of FETs and that electrically isolates a pair of adjacent FETs, the electrical isolation circuit including a single capacitor connected to a gate of each of the pair of adjacent FETs; and
at least one diode embedded within each of the plurality of FETs.

11. A FET array in accordance with claim 10 further comprising at least one resistor connected to the at least one diode embedded within each of the plurality of FETs, and wherein the at least one diode and the at least one resistor are thermally coupled to the FETs.

12. A FET array in accordance with claim 11 wherein the at least one diode and the at least one resistor comprise a negative thermal feedback circuit.

13. A FET array in accordance with claim 10 wherein a gate of each of the FETs is DC isolated to provide electrical gate bias isolation with the electrical isolation circuit.

14. A FET array in accordance with claim 13 wherein the electrical isolation circuit comprises a pair of resistors in operational electrical connection with the capacitor in an odd mode oscillation suppression configuration and having individual active FET thermal compensation.

15. A FET array in accordance with claim 10 further comprising a gap between first and second portions of each of the FETs, and wherein the at least one diode is embedded within the gap.

16. A FET array in accordance with claim 10 wherein the at least one diode is configured to provide individual FET thermal compensation.

17. A FET array in accordance with claim 16 wherein the plurality of FETs comprise at least sixteen FETs.

* * * * *